United States Patent [19]

Delahunt

[11] Patent Number: 4,575,815

[45] Date of Patent: Mar. 11, 1986

[54] DATA STORAGE UNIT

[75] Inventor: Stephen J. Delahunt, Harvard, Mass.

[73] Assignee: International Computers Limited, London, England

[21] Appl. No.: 761,149

[22] Filed: Aug. 1, 1985

Related U.S. Application Data

[63] Continuation of Ser. No. 446,600, Dec. 3, 1982, abandoned.

[30] Foreign Application Priority Data

Oct. 12, 1982 [GB] United Kingdom ............... 8229063

[51] Int. Cl.⁴ .............................................. G06F 1/04
[52] U.S. Cl. ........................................ 364/900; 328/59
[58] Field of Search ... 364/200 MS File, 900 MS File; 307/269; 328/59, 60, 62, 55; 368/251

[56] References Cited

U.S. PATENT DOCUMENTS

| | | | |
|---|---|---|---|
| 3,443,070 | 5/1969 | Derby et al. ........................ | 364/200 |
| 3,866,022 | 2/1975 | Fletcher et al. .................... | 377/108 |
| 4,063,308 | 12/1977 | Collins et al. ...................... | 364/200 |
| 4,095,265 | 6/1978 | Vrba ................................... | 364/200 |
| 4,122,309 | 10/1978 | Jacobsen ............................. | 328/60 |
| 4,165,490 | 8/1979 | Howe, Jr. et al. .................. | 328/60 |
| 4,257,108 | 3/1981 | Igel ..................................... | 364/900 |
| 4,321,687 | 3/1982 | Parsons et al. ..................... | 364/900 |

OTHER PUBLICATIONS

MC 68540-Error Detection and Correction Circuit, Product Preview, Motorola, 1981 pp. 1-8.

*Primary Examiner*—Eddie P. Chan
*Attorney, Agent, or Firm*—Lee, Smith & Zickert

[57] ABSTRACT

In a data storage unit, internal timing signals are produced by scanning a writable control memory. Thus, the timing of the storage unit can easily be varied, simply by re-writing the contents of the control memory. This allows the use of a faster clock rate without the necessity for complete redesign of the storage unit. The basic clock period is sub-divided into a number of sub-periods, allowing the timing signals to be adjusted with an accuracy better than one clock period.

4 Claims, 2 Drawing Figures

DATA STORAGE UNIT

This application is a continuation of U.S. patent application Ser. No. 446,600, filed Dec. 3, 1982, and now abandoned.

BACKGROUND OF THE INVENTION

This invention relates to a data storage unit for a data processing system.

A data processing system normally includes a data processing unit and a data storage unit, and is designed to operate at some particular clock rate. The timing of the storage unit tends to be long compared with the clock period so that, typically, each storage access cycle may take four or five clock beats to complete. If the processing unit is upgraded or re-designed to operate at a faster clock rate, it is usually necessary also to re-design the storage unit to operate at the faster speed. However, this may be very costly, especially where the storage unit is implemented in large scale integrated circuit (LSI) technology.

One object of the present invention is to provide a data storage unit which can readily be adapted for use in systems with different clock rates without having to be re-designed.

SUMMARY OF THE INVENTION

According to the invention there is provided a data storage unit having timing control means for producing a plurality of internal timing signals for the unit, the timing control means comprising:

(a) a control memory having a plurality of individually addressable locations, (b) means for scanning the locations so as to read out the contents of successive locations in successive clock beats, and (c) means for utilising the contents of each location read out of the control memory to produce the timing signals.

Thus, it can be seen that the timing of the data storage unit can readily be altered to accommodate different clock rates, simply by changing the contents of the control memory.

In a preferred form of the invention, only a sub-set of bit storage positions in the control memory are physically implemented with bit storage circuits, the remaining bit storage positions being unimplemented. This is possible because, in general, as will be described, many of the bit storage positions are never used in practice. This feature leads to a considerable saving in the amount of hardware needed to construct the control memory.

It may sometimes be desirable to set a timing signal to an accuracy better than one period of the clock signal. The accuracy of timing could, for example, be increased by a factor of n by increasing the number of locations in the control memory by a factor of n and scanning the locations at n times the clock rate. However, this could result in an excessively large control memory.

In a preferred arrangement in accordance with the invention, the timing control means further includes means for producing a plurality of further clock signals subdividing each clock period into a plurality of sub-periods, means for selecting one of the further clock signals, and gating means for combining the selected further clock signal with the output of the control memory to produce one of the timing signals.

BRIEF DESCRIPTION OF THE DRAWINGS

One data storage unit in accordance with the invention will now be described by way of example with reference to the accompanying drawings of which.

DESCRIPTION OF AN EMBODIMENT OF THE INVENTION

Figure 1:
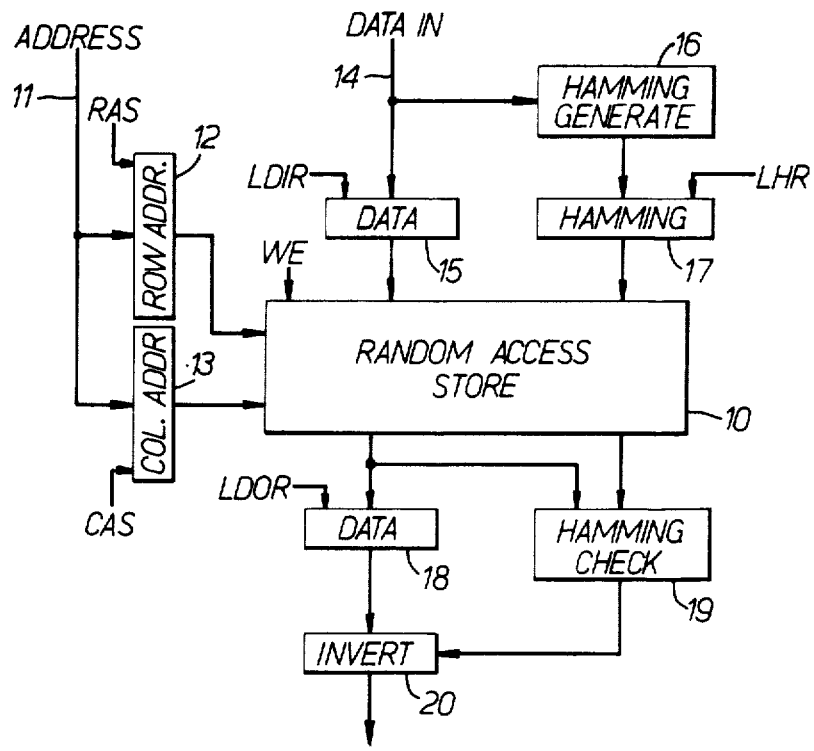
FIG. 1 is an overall block diagram of the storage unit.

Referring to FIG. 1, the data storage unit comprises a random-access data store 10 having 256K locations. Each location contains 32 data bits and seven Hamming code bits for checking and correcting the data.

The store 10 is addressed by an 18-bit address received in two successive portions over a nine-bit wide address path 11. The first nine-bit portion, referred to as the row address, is gated into a register 12 by a timing signal RAS (row address strobe). The second portion, referred to as the column address, is gated into a register 13 by a timing signal CAS (column address strobe).

Input data for writing into the store 10 is received over a data input path 14 and is gated into a register 15 by a timing signal LDIR (load data input register). The input data is also fed to a Hamming code generator 16 to produce a seven bit Hamming code corresponding to the data. This code is gated into a register 17 by a timing signal LHR (load Hamming register).

The contents of the registers 15,17 can then be written into the addressed location of the store 10 by means of a timing signal WE (write enable).

Data from the currently addressed location of the store 10 can be gated into a register 18 by a timing signal LDOR (load data output register). The output data is also fed, along with the associated Hamming code from the store 10, to a Hamming checking circuit 19 which checks the data to ensure that it agrees with the Hamming code. If an error is detected, the circuit 19 indicates which bit is in error, and produces an output signal to a set of inversion circuits 20 so as to invert (and hence correct) the faulty bit.

Hamming code generation and checking circuits are well known in the art and so it is not necessary to describe these in detail in this specification.

It will be appreciated that the timing signals RAS, CAS, WE, LDIR, LHR and LDOR must all be produced at carefully controlled points of time in the operational cycle of the data storage unit, to ensure that the storage unit operates correctly. For example, in the case of a READ operation, the signals RAS and CAS must be produced first, so as to enter the address into the registers 12, 13. Sufficient time must then elapse to allow the store addressing logic to operate before generating the LDOR signal to gate the required data into the register 18.

Figure 2:
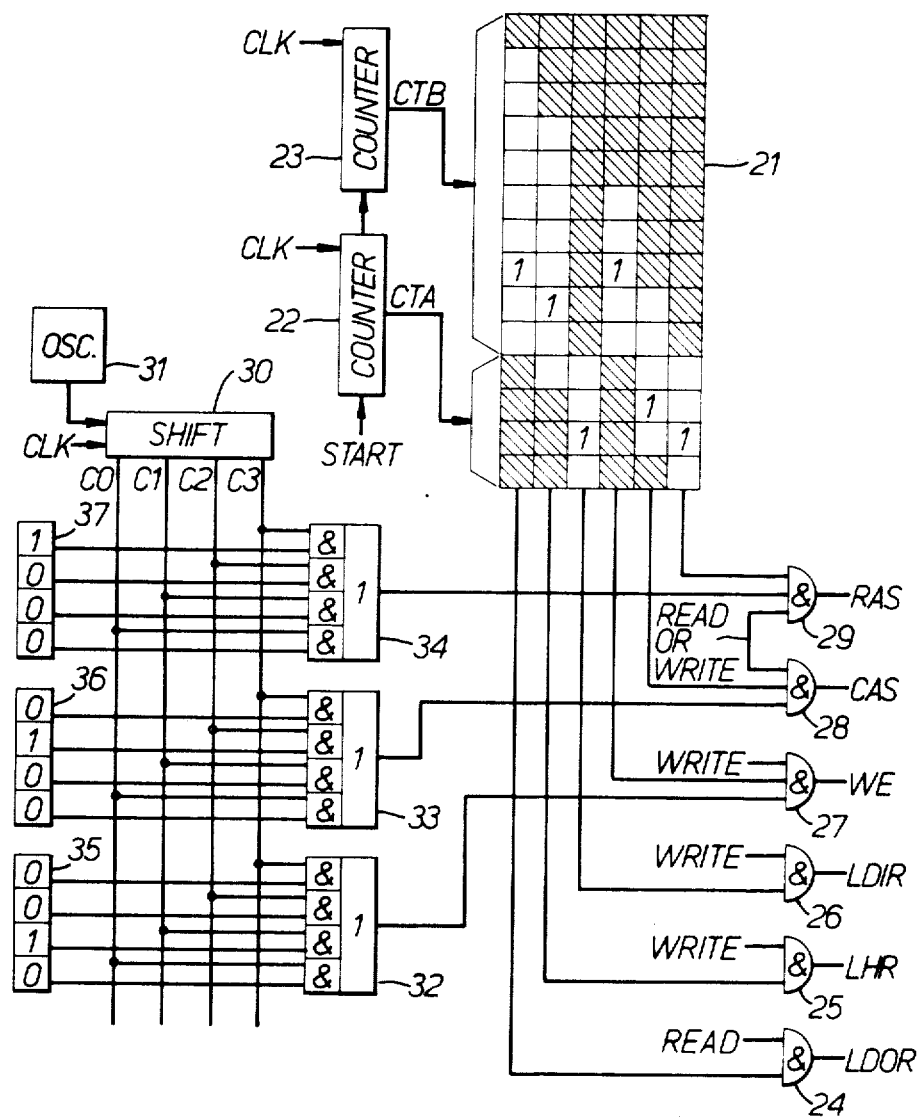
FIG. 2 is a circuit diagram of a timing control circuit for the storage unit.

These timing signals are produced by the timing control circuit shown in FIG. 2. Referring to FIG. 2, the timing control circuit comprises a control memory 21 having fourteen individually addressable rows, each row containing a pattern of six bits. The first four rows are addressed by a two-bit address CTA from a first counter 22. The other ten rows are addressed by a four-bit address CTB from a second counter 23. Both counters are clocked by a system clock signal CLK.

In operation, the first counter 22 is triggered at the start of each operational cycle of the storage unit. It then counts from 0–3 so as to scan the first four rows of the control memory 21 in four successive clock beats. When the counter 22 reaches its maximum count, it stops and triggers the second counter 23. This counter then resets and counts from 0–9 so as to scan the remaining rows of the control memory.

The reason for using two counters 22,23 to address the memory 21 is to allow the first counter 22 to be restarted before the second counter 23 has finished counting. This allows a new operational cycle to be overlapped with the preceding cycle.

Whenever a row of the control memory is addressed, its contents are read out and applied to six AND gates 24–29, the outputs of which provide the six timing signals LDOR, LHR, LDIR, WE, CAS and RAS. The gates 24–29 are also controlled by function control signals READ and WRITE as shown.

Thus, for example, it can be seen that the timing signal LDOR is produced when the READ signal is true and at the same time the output from the first column of the control memory 21 is true. The particular clock beat at which the signal LDOR occurs can therefore be specified by placing a binary "1" at the appropriate position in the first column of the memory 21. For example, if it is desired that LDOR should occur seven clock beats after the start of the operational cycle, a "1" would be placed in the seventh row of the first column, all other bits in this column being set to zero.

It should be noted that the signal LDOR always occurs at the start of the specified clock beat. The same applies to LHR and LDIR. However, in the case of signals WE, CAS and RAS, it is possible to set the timing of these signals to an accuracy of one quarter of the clock period. This helps to speed up the operation of the storage unit since, if this facility were not provided, it would be necessary to round up the timings of WE, CAS and RAS to the nearest whole clock beats. The way in which this more accurate timing is achieved is as follows.

The clock signal CLK is applied to the input of a four-stage shift register 30 which is driven by an oscillator 31 running at four times the frequency of the clock CLK. The outputs of the four stages of the shift register provide four further clock signals C0–C3. It can be seen that these further clock signals sub-divide each beat of CLK into four quarters.

The signals C0–C3 are applied to the inputs of three four-way selector circuits 32,33,34 each of which consists of four AND gates whose outputs are combined in an OR gate. Each selector circuit is controlled by the contents of a four-bit register 35,36,37 which determines which of the four clock signals C0–C3 is selected by that circuit. For example, if the register 35 contains the pattern 0100 as shown, the circuit 32 will select the clock signal C1.

The outputs of the selector circuits 35–37 are fed respectively to the inputs of the AND gates 27,28,29 to control the timing of the signals WE, CAS and RAS to the nearest quarter clock beat.

The storage unit described above is usable in systems with a variety of different system clock (CLK) rates. When the clock rate is changed, it is necessary to vary the number of clock beats allowed for each action within the storage unit, so as to ensure that the time allowed for each such action remains substantially constant. This is achieved simply by changing the contents of the control memory 21 and the registers 35–37 in an appropriate manner. For example, if the clock rate is increased, the contents of the control memory 21 would be altered by moving each "1" bit in it upwards by one or more rows.

Although the control memory 21 is logically a two-dimensional array of bit positions, in practice not all the bit positions need to be physically implemented by bit storage circuits. For example, the signals RAS and CAS always occur near the beginning of the operational cycle and hence it is unnecessary to provide any bit storage circuits in the last two columns of the memory 21 at bit positions corresponding to the occurrence of these signals towards the end of the cycle.

In the particular embodiment of the invention shown in FIG. 2, the bit positions of the memory which are not physically implemented are shown shaded. Thus, only the unshaded positions correspond to actual bit storage circuits. The output of the shaded (i.e. unimplemented) bit positions are always zero. It can be seen that the memory 21 thus requires less than half the number of bit storage circuits compared with the number required to implement the complete array.

I claim:

1. A data storage unit having timing control means for producing internal timing signals for the unit on a plurality of timing signal lines, the timing control means comprising:
  (a) a writable control memory having a plurality of individually addressed locations, each location containing a word having a plurality of bits each bit corresponding respectively to each of said plurality of timing signal lines,
  (b) means for generating a sequence of clock signals,
  (c) means responsive to the sequence of clock signals for addressing the locations of the control memory sequentially to read out the words from successive locations in successive clock signals,
  (d) means connected to said clock signals generating means for producing a plurality of further clock signals sub-dividing each of said clock signal into a plurality of sub-clock signals,
  (e) means connected to said further clock signals producing means for selecting one of the further clock signals for each timing signal line, and
  (f) gating means responsive to the selected further clock signals and to each word out of the control memory, for producing a timing signal on each said timing signal line whenever the corresponding bit of the word read out of the control memory is set to a predetermined value.

2. A data storage unit according to claim 1 wherein the means for producing the plurality of further clock signals comprises a shift register connected to receive shift pulses from an oscillator.

3. A data storage unit according to claim 1, including data input and output registers, and at least one address register, wherein said internal timing signals include gating signals for controlling the loading of information into those registers.

4. A data storage unit according to claim 3 further including a Hamming code register, wherein said internal timing signals further include a gating signal for controlling the loading of a Hamming code into that register.

* * * * *